United States Patent
Shih

(10) Patent No.: US 9,705,261 B2
(45) Date of Patent: Jul. 11, 2017

(54) CONTROL APPARATUS, CONNECTOR, AND LAMINATED CAPACITOR FOR CONNECTOR

(71) Applicant: Hitachi Automotive Systems, Ltd., Hitachinaka-shi, Ibaraki (JP)

(72) Inventor: Hsinhan Shih, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 23 days.

(21) Appl. No.: 14/787,338

(22) PCT Filed: Mar. 10, 2014

(86) PCT No.: PCT/JP2014/056100
§ 371 (c)(1),
(2) Date: Oct. 27, 2015

(87) PCT Pub. No.: WO2014/188758
PCT Pub. Date: Nov. 27, 2014

(65) Prior Publication Data
US 2016/0072228 A1     Mar. 10, 2016

(30) Foreign Application Priority Data

May 22, 2013 (JP) ................................. 2013-108172

(51) Int. Cl.
H01R 13/66 (2006.01)
H01G 4/30 (2006.01)
(Continued)

(52) U.S. Cl.
CPC .......... *H01R 13/6625* (2013.01); *H01G 2/06* (2013.01); *H01G 4/012* (2013.01); *H01G 4/12* (2013.01);
(Continued)

(58) Field of Classification Search
CPC ........................... H01G 4/224; H01R 13/6625
See application file for complete search history.

(56) References Cited

U.S. PATENT DOCUMENTS

| | | | | |
|---|---|---|---|---|
| 5,580,279 A | * | 12/1996 | Belopolsky | H01R 13/6625 439/620.09 |
| 5,905,627 A | * | 5/1999 | Brendel | H01G 4/35 333/182 |
| 8,642,887 B1 | * | 2/2014 | Li | A61N 1/3754 174/50.6 |
| 2003/0139096 A1 | * | 7/2003 | Stevenson | A61N 1/3754 333/182 |
| 2005/0221638 A1 | * | 10/2005 | Berberich | H01R 13/6625 439/76.1 |
| 2007/0134985 A1 | * | 6/2007 | Frysz | H01G 4/232 439/620.09 |
| 2011/0226524 A1 | | 9/2011 | Hagiwara et al. | |
| 2011/0303458 A1 | * | 12/2011 | Sutay | H01G 4/35 174/650 |
| 2012/0309237 A1 | * | 12/2012 | Marzano | A61N 1/3754 439/675 |

(Continued)

FOREIGN PATENT DOCUMENTS

| | | |
|---|---|---|
| JP | 5-234643 A | 9/1993 |
| JP | 2001-307910 A | 11/2001 |

(Continued)

OTHER PUBLICATIONS

International Search Report (PCT/ISA/210) issued in PCT Application No. PCT/JP2014/056100 dated Jul. 1, 2014 with English-language translation (two (2) pages).

*Primary Examiner* — James Harvey
(74) *Attorney, Agent, or Firm* — Crowell & Moring LLP

(57) ABSTRACT

Provide are a control apparatus, a connector, and a laminated capacitor for connector which are small and light and in which the capacitor capacitances on the terminals can be easily adjusted. A laminated capacitor 113 is integrally formed by laminating: a terminal dielectric sheet 123*a* on which is printed a terminal circuit pattern P10*a* having terminal connecting patterns P12*a* electrically connected to a plurality of connection terminals 111 and terminal-side electrode patterns P11*a* connected to the terminal connecting patterns P12*a*; and a ground dielectric sheet 123*b* on which is printed a ground circuit pattern P10*b* having ground-side electrode patterns P11*b* disposed to face the terminal-side electrode patterns P11*a* and a ground pattern P12*b* connected to the ground-side electrode patterns P11*b*.

18 Claims, 12 Drawing Sheets

(51) Int. Cl.
    *H01G 4/40*    (2006.01)
    *H01G 4/012*    (2006.01)
    *H01G 4/12*    (2006.01)
    *H01G 4/228*    (2006.01)
    *H01R 13/6466*    (2011.01)
    *H05K 1/18*    (2006.01)
    *H01G 2/06*    (2006.01)
    *H01G 4/232*    (2006.01)
    *H01G 4/236*    (2006.01)

(52) U.S. Cl.
    CPC ............. *H01G 4/228* (2013.01); *H01G 4/232* (2013.01); *H01G 4/30* (2013.01); *H01G 4/40* (2013.01); *H01R 13/6466* (2013.01); *H05K 1/18* (2013.01); *H01G 4/236* (2013.01)

(56) References Cited

U.S. PATENT DOCUMENTS

2016/0072228 A1*    3/2016    Shih ..................... H01G 4/30
                                                                    439/620.21

FOREIGN PATENT DOCUMENTS

| JP | 2006-25145 A | 1/2006 |
| JP | 2007-287642 A | 11/2007 |
| JP | 2011-192599 A | 9/2011 |

* cited by examiner

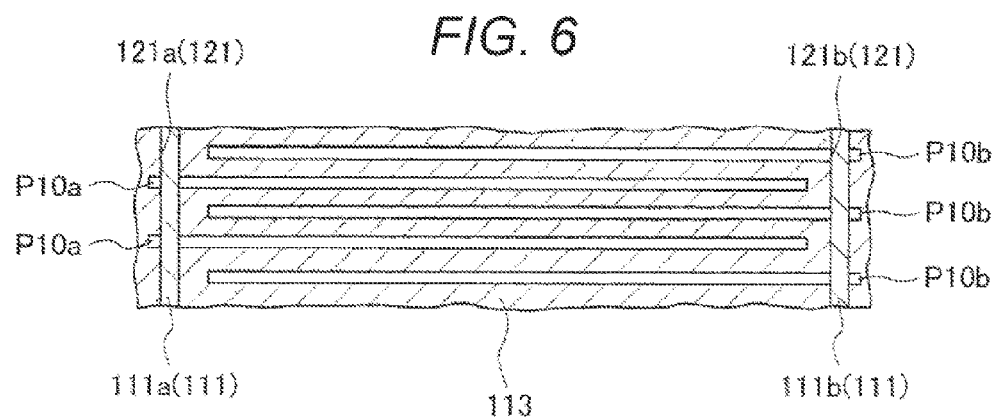
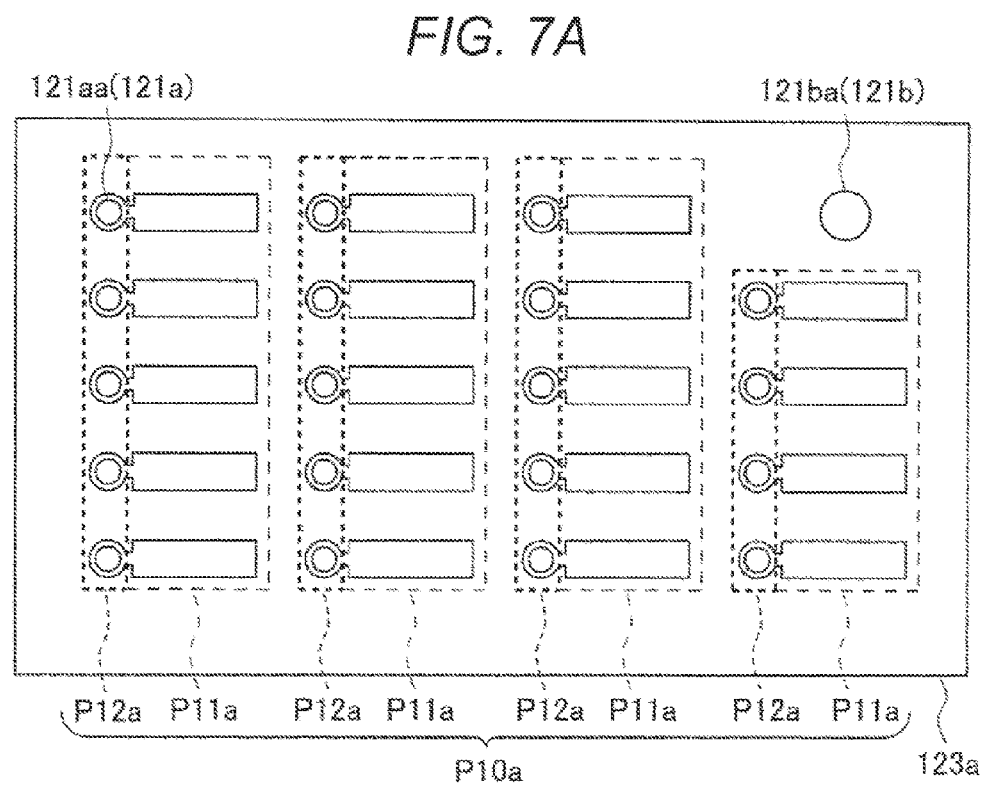

CONTROL APPARATUS, CONNECTOR, AND LAMINATED CAPACITOR FOR CONNECTOR

TECHNICAL FIELD

The present invention relates to a control apparatus, a connector, and a laminated capacitor for connector, and relates to, for example, an in-vehicle control apparatus for in-vehicle equipment installed in a vehicle, a connector for the control apparatus, and a laminated capacitor for the connector.

BACKGROUND ART

Conventionally, in a vehicle such as an automobile, there are embedded many control apparatuses (electronic control units or ECUs) for controlling in-vehicle equipment installed in the vehicle. In particular, in order to improve user's comfort and safety of vehicles, a recent vehicle is equipped with, for example, air-conditioning equipment and audio equipment, information equipment such as a navigation system, safety equipment such as a camera and a sensor for obtaining information outside the car, motor-driven equipment such as a power window, a power seat, and a power steering, and other equipment; thus, in order to precisely control these various pieces of in-vehicle equipment, even more control apparatuses are embedded. Further, each control apparatus is equipped with even more input/output terminals to improve function of each control apparatus; thus, it is becoming difficult to appropriately dispose such highly functionalized control apparatuses in a restricted space in the vehicle.

To address these issues, PTLs 1 to 3 disclose a technology which makes the whole of a control apparatus small and light by embedding capacitors in a connector, where the capacitors block or reduce noise and static electricity which are caused by operations of a motor and an injector (fuel injection valve) installed in the vehicle or caused by energization of wires.

In a joint connector with a built-in capacitor disclosed in the PTL 1, a capacitor is electrically connected between a connection part at which a power source side capacitor is connected to a power source side bus bar and a connection part at which an earth side capacitor is connected to an earth side bus bar; and in a connector housing, a positioning member is provided to guide the capacitor to be disposed between the connection parts.

Further, in an electronic equipment apparatus disclosed in PTL 2, a capacitor is attached to a pair of power source connection terminals of the connector, and the pair of power source connection terminals are electrically connected through the capacitor.

Further, in a noise countermeasure connector disclosed in PTL 3, a connector is combined with a feedthrough capacitor formed of a laminated component, wherein the feed through capacitor is made of conductor and dielectric material laminated in a block shape, near the conductor there are provided through holes or notches through each of which each of a plurality of metal terminal of the connector passes, and the feedthrough capacitor has on the outer surface a ground terminal connected to the conductor.

CITATION LIST

Patent Literatures

PTL 1: JP 2007-287642 A
PTL 2: JP 2011-192599 A
PTL 3: JP 5-234643 A

SUMMARY OF INVENTION

Technical Problem

However, in the joint connector with built-in a capacitor disclosed in PTL 1 and the electronic equipment apparatus disclosed in PTL 2, the capacitor built in the connector is formed of a main body having an approximate cuboid shape or formed of a pillar whose cross section is an ellipse; therefore, there is a problem that if the number of the input/output terminals becomes large due to higher functionality of the control apparatus as described above, the whole of the control apparatus becomes large.

Further, in the noise countermeasure connector disclosed in PTL 3, the feedthrough capacitor is formed in the process: after dielectric material such as silicon dioxide and conductor for electrode made of silver or the like are serially laminated by a printing method or a sheet method and are sintered or after a laminated body having a block shape is formed by a sputtering method or an evaporation method, the terminal connected to the conductor is glazed on the outer surface of the block; and then, the dielectric material and the conductor for electrode are laminated in the vertical direction; thus, there is a problem that it is difficult to precisely adjust the capacitor capacitances on the terminals.

The present invention is made in view of the above problem, and an object of the invention is to provide a control apparatus, a connector, and a laminated capacitor for connector which are small and light and in which the capacitor capacitances on the terminals can be easily adjusted.

Solution to Problem

To achieve the above object, a control apparatus according to the present invention includes: a substrate on which an electronic component for controlling an external device is mounted; a connector which electrically connects the substrate to the external device or external wires, and the connector includes: a plurality of connection terminals which connect the substrate to the external device or the external wires; and a laminated capacitor in which a terminal dielectric sheet on which a terminal circuit pattern is printed and a ground dielectric sheet on which a ground circuit pattern is printed are alternately laminated into one body, and the terminal circuit pattern includes terminal connecting patterns electrically connected to the plurality of connection terminals; and terminal-side electrode patterns connected to the terminal connecting patterns, and the ground circuit pattern includes: ground-side electrode patterns disposed to face the terminal-side electrode patterns; and a ground pattern connected to the ground-side electrode patterns.

In addition, a connector according to the present invention is a connector which electrically connects a substrate, on which an electronic component for controlling an external device is mounted, to the external device or external wires, the connector including: a plurality of connection terminals which connect the substrate to the external device or the external wires; and a laminated capacitor in which a terminal dielectric sheet on which a terminal circuit pattern is printed and a ground dielectric sheet on which a ground circuit pattern is printed are alternately laminated into one body, wherein the terminal circuit pattern includes: terminal connecting patterns electrically connected to the plurality of connection terminals; and terminal-side electrode patterns connected to the terminal connecting patterns, and the ground circuit pattern includes: ground-side electrode patterns disposed to face the terminal-side electrode patterns; and a ground pattern connected to the ground-side electrode patterns.

In addition, a laminated capacitor according to the present invention is a laminated capacitor for a connector which electrically connects a substrate, on which an electronic component for controlling an external device is mounted, to the external device or external wires, the laminated capacitor including: a terminal dielectric sheet and a ground dielectric sheet which are alternately laminated into one body, wherein on the terminal dielectric sheet, a terminal circuit pattern having terminal connecting patterns electrically connected to a plurality of connection terminals which connect the substrate to the external device or the external wires and terminal-side electrode patterns connected to the terminal connecting patterns is printed, and on the ground dielectric sheet, a ground circuit pattern having ground-side electrode patterns disposed to face the terminal-side electrode patterns and a ground pattern connected to the ground-side electrode patterns is printed.

Advantageous Effects of Invention

According to a control apparatus, a connector, and a laminated capacitor for connector of the present invention, the laminated capacitor constituting the control apparatus, the connector, and the laminated capacitor for connector is made of a terminal dielectric sheet on which a terminal circuit pattern is printed and a ground dielectric sheet on which a ground circuit pattern is printed are alternately laminated into one body; therefore, the control apparatus, the connector, and the laminated capacitor for connector can be small and light even in a case that the number of the input/output terminals becomes large due to, for example, higher functionality of the control apparatus; and in addition, when the electrode patterns on a terminal side and a ground side of the circuit patterns for the terminals and the ground are modified at the time of manufacturing the terminal dielectric sheet and the ground dielectric sheet, the capacitor capacitances on the connection terminals can be easily adjusted.

A problem, a configuration, and an advantageous effect other than the above-described ones will be made clear by the following descriptions of the embodiments.

BRIEF DESCRIPTION OF DRAWINGS

FIG. 6 is a partially enlarged sectional view of a part of the laminated ceramic capacitor shown in FIG. 4 in a partially enlarged state.

FIG. 7A is an upper surface view showing a terminal dielectric sheet forming the laminated ceramic capacitor shown in FIG. 6.

DESCRIPTION OF EMBODIMENTS

In the following, an embodiment of a control apparatus, a connector, and a laminated capacitor for connector according to the present invention will be described with reference to the drawings.

[First Embodiment]

Figure 1:
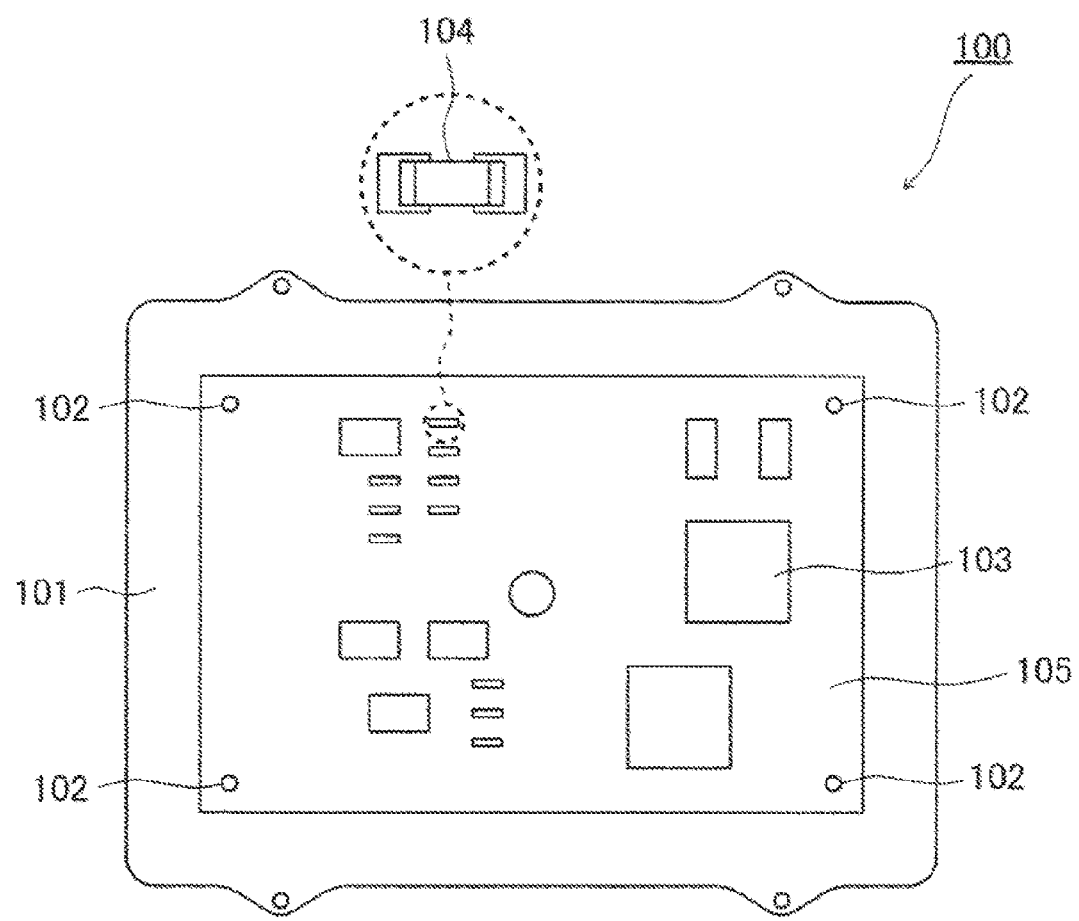
FIG. 1 is an upper surface view showing a basic configuration of a first embodiment of a control apparatus according to the present invention.
Figure 2:
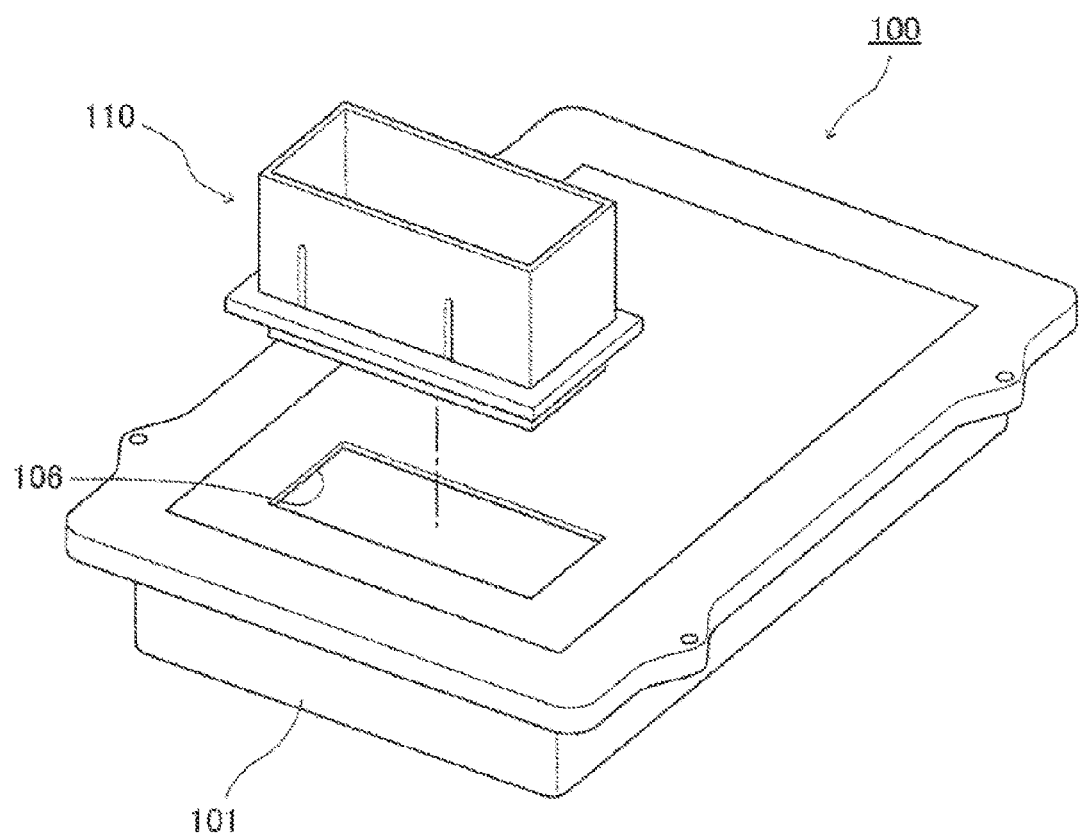
FIG. 2 is an exploded perspective view showing a lower surface of the control apparatus shown in FIG. 1 in an exploded state.
Figure 3:
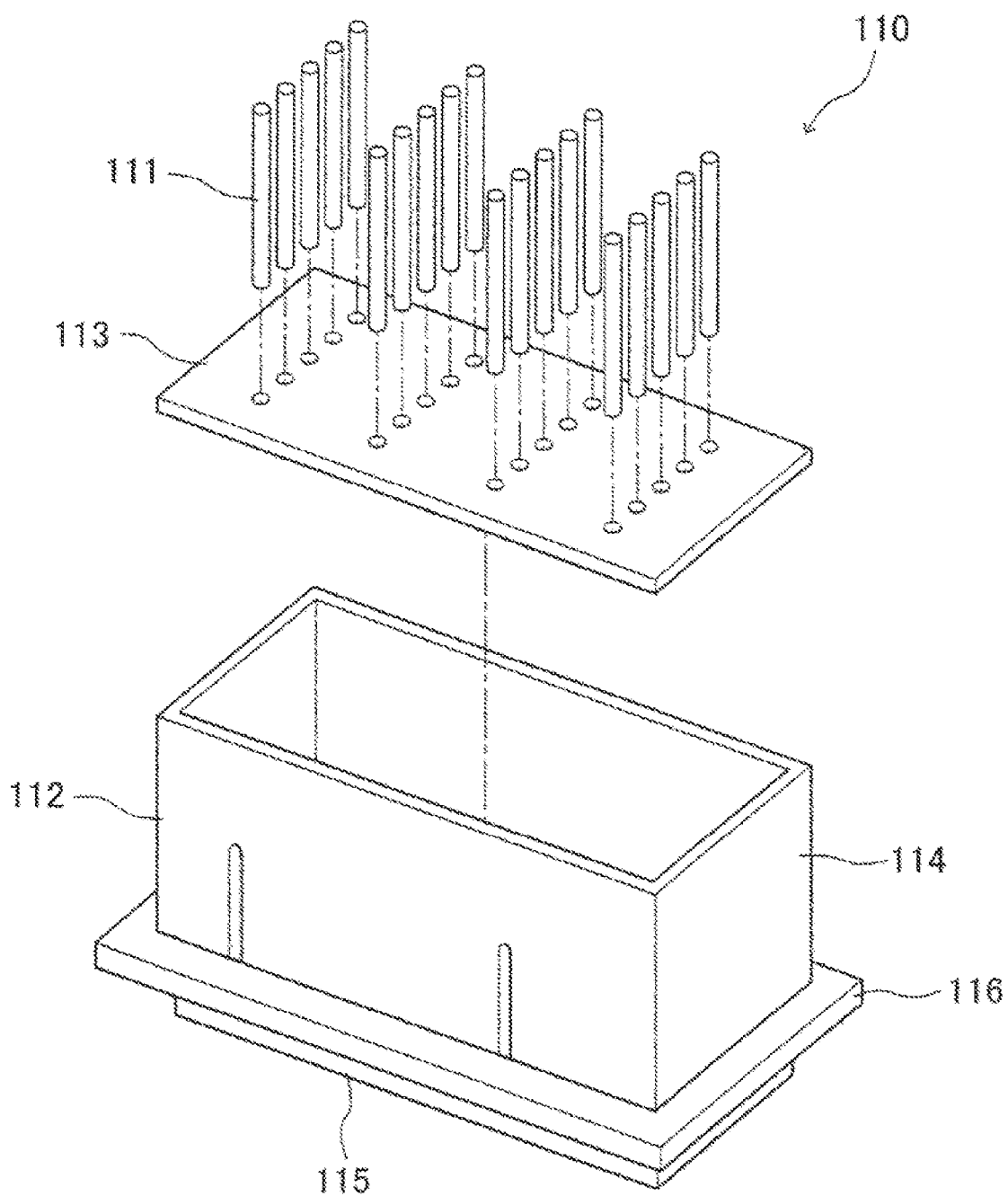
FIG. 3 is an exploded perspective view showing the connector shown in FIG. 2 in an exploded state.
Figure 4:
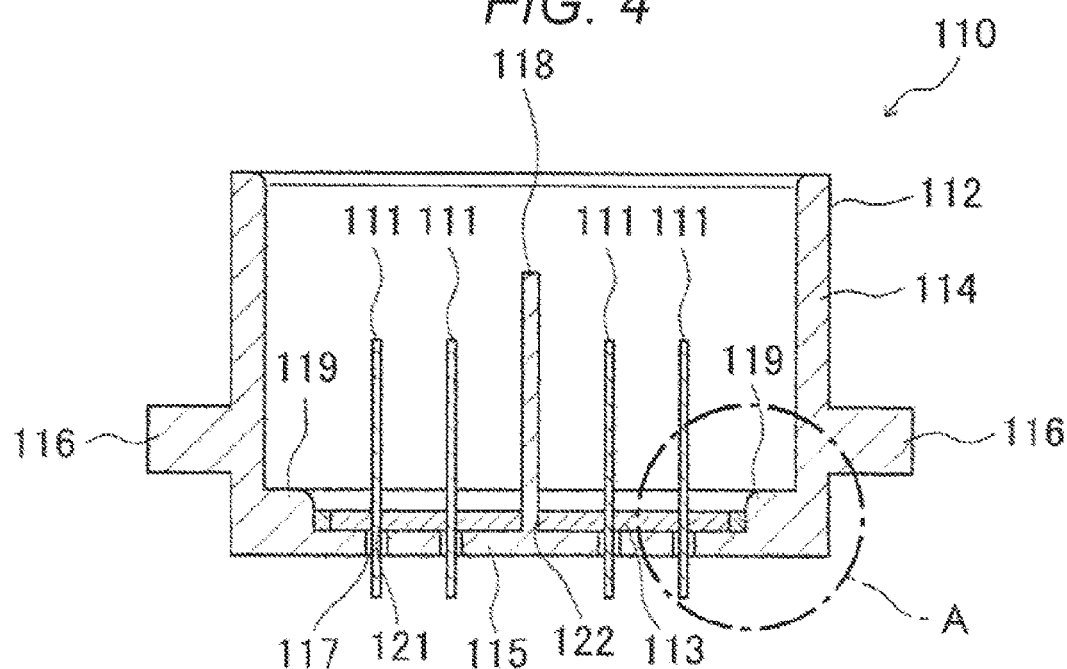
FIG. 4 is a vertical sectional view of the connector shown in FIG. 3.
Figure 5:
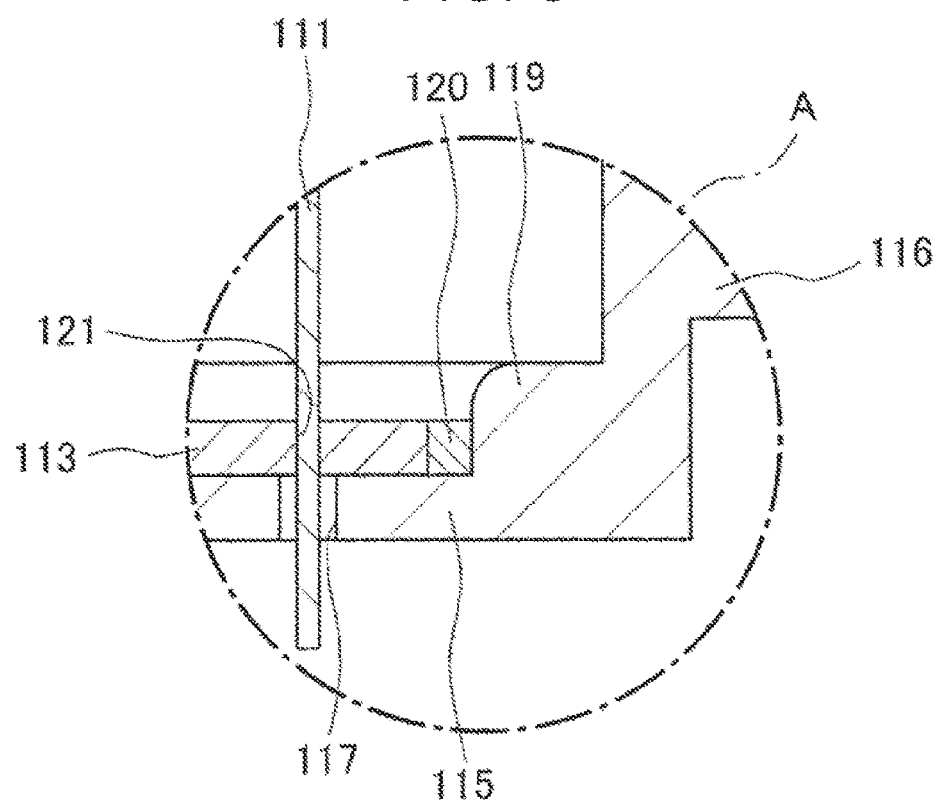
FIG. 5 is an enlarged view of A part shown in FIG. 4 in an enlarged state.

FIG. 1 shows a basic configuration of a first embodiment of the control apparatus according to the present invention. Further, FIG. 2 shows a lower surface of the control apparatus shown in FIG. 1 in an exploded state. Further, FIG. 3 shows the connector shown in FIG. 2 in an exploded state, FIG. 4 shows a vertical sectional view of the connector shown in FIG. 3 in an exploded state, and FIG. 5 shows A part in FIG. 4 in an enlarged state.

As shown in FIG. 1, the control apparatus (electronic control unit or ECU) 100 is mainly equipped with a main body case 101 and a printed circuit board (substrate) 105 fixedly disposed on the main body case 101 with fixing members 102 such as screws.

On the printed circuit board 105, electronic components such as an IC 103, a capacitor 104, and the like are mounted at appropriate positions by soldering or the like, where the IC 103 controls, for example, an external device such as in-vehicle equipment installed in a vehicle. Note that the printed circuit board 105 is formed of, for example, insulating resin or the like such as glass epoxy resin; on the surface of the printed circuit board 105, an appropriate wiring circuit pattern (not shown) is formed; and the above electronic components and the wiring circuit pattern constitute a control circuit which controls the external device.

In the lower surface of the main body case 101, an approximately rectangular through-hole 106 is formed as shown FIG. 2, a connector 110 is fit in the through-hole 106, and the printed circuit board 105 is electrically connected to the external device and external wires through the connector 110.

As shown in FIG. 3, the connector 110 mainly includes a plurality of connection terminals 111 for connecting the printed circuit board 105 to the external device and the external wires, a connector housing 112 for housing and protecting the plurality of connection terminals 111, a laminated ceramic capacitor (laminated capacitor) 113 for blocking or reducing noise and static electricity which are caused by operations of actuators such as a motor and an injector (fuel injection valve) installed in the vehicle or caused by energization of the wires.

The connection terminals 111 have a rod shape and include, for example, 100 pieces or more of input/output pins 111a and a ground pin 111b as described later (see FIG. 6).

The connector housing 112 mainly has: a cylindrical body 114 having an approximately rectangular cross-section and a shape complementary to the through-hole 106 in the main body case 101 and surrounding the plurality of connection terminals 111; and a bottom plate 115 closing an end part of the cylindrical body 114 on the printed circuit board 105 side.

On an outer circumferential surface of the cylindrical body 114, there is formed a projection portion 116 which defines a position of the connector housing 112 with respect to the main body case 101 when the connector housing 112 is fit into the through-hole 106 in the main body case 101. Further, in the bottom plate 115 there is formed as shown in FIG. 4 through-holes 117 through each of which a part of the connection terminal 111 passes, and approximately at the center of the bottom plate 115 there is formed a positioning part 118 to position the laminated ceramic capacitor 113. Further, at a corner part formed between the end part of the cylindrical body 114 on the printed circuit board 105 side and the bottom plate 115, a thick part 119 is formed to hold the shape of the cylindrical body 114, and in the area defined by the bottom plate 115 and the thick part 119, the laminated ceramic capacitor 113 is disposed.

Here, between a peripheral edge of the laminated ceramic capacitor 113 and the thick part 119, there is attached as shown in FIG. 5 an elastic resin adhesive member (buffering member) 120 formed of silicon or the like, for example; and the laminated ceramic capacitor 113 is integrally and fixedly disposed on the connector housing 112 in a posture of being clamped by the resin adhesive member 120 and being in contact with the bottom plate 115. With this arrangement, when the control apparatus 100 is installed, for example, in a vehicle and even when vibration is caused to the control apparatus 100 due to running of the vehicle or other reasons, impact to the laminated ceramic capacitor 113 caused by the vibration can be reduced. Note that if the impact to the laminated ceramic capacitor 113 is small, the resin adhesive member 120 disposed on the peripheral edge of the laminated ceramic capacitor 113 can be omitted.

In the laminated ceramic capacitor 113, there are formed the through-holes 121 through which the connection terminals 111 pass and a positioning hole 122 through which the positioning part 118 passes, at the positions corresponding to the through-holes 117 formed in the bottom plate 115 of the connector housing 112 and the positioning part 118.

FIG. 6 shows a part of the laminated ceramic capacitor shown in FIG. 4 in an enlarged state. In addition, FIG. 7A shows a terminal dielectric sheet for forming the laminated ceramic capacitor shown in FIG. 6, and FIG. 7B shows a ground dielectric sheet for the laminated ceramic capacitor.

As shown in FIG. 6, the laminated ceramic capacitor 113 is formed such that the terminal dielectric sheet on which a terminal circuit pattern P10a is printed and the ground dielectric sheet on which a ground circuit pattern P10b is printed are alternately laminated into one body. As described above, in the laminated ceramic capacitor 113, there are formed in a lamination direction the through-holes 121 through which the connection terminals 111ii pass; the input/output pins 111a of the connection terminals 111 are fit, in the lamination direction, in the through-holes 121a, for the terminal, of the through-holes 121 and are electrically connected to the terminal circuit pattern P10a; and the ground pin 111b of the connection terminals 111 is fit, in the lamination direction, in the through-hole 121b, for the ground, of the through-holes 121 and is electrically connected to the ground circuit pattern P10b.

Figure 7B:
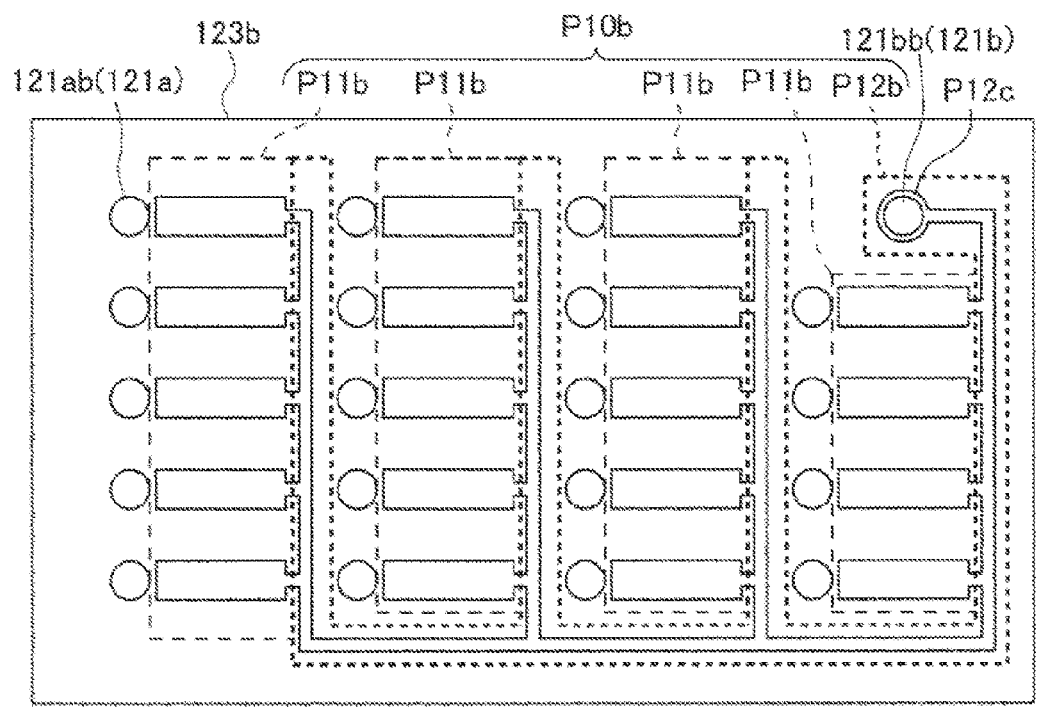
FIG. 7B is an upper surface view showing a ground dielectric sheet forming the laminated ceramic capacitor shown in FIG. 6.

In more detail, as shown in FIG. 7A and FIG. 7B, the laminated ceramic capacitor 113 is formed such that a terminal dielectric sheet 123a and a ground dielectric sheet 123b are alternately laminated, where on the terminal dielectric sheet 123a, the terminal circuit pattern P10a formed of terminal connecting patterns P12a to be electrically connected to the input/output pins 111a of the connection terminals 111 and the terminal-side electrode patterns P11a connected to the terminal connecting patterns P12a is printed, and where on the ground dielectric sheet 123b, the ground circuit pattern P10b formed of ground-side electrode patterns P11b which are disposed to face the terminal-side electrode patterns P11a (are disposed to overlap the terminal-side electrode patterns P11a when viewed from the lamination direction) and a ground pattern P12b connected to the ground-side electrode patterns P11b is printed.

In addition, the plurality of input/output pins 111a are fit, in the lamination direction, in through-holes 121aa (121a) each formed in each of the terminal connecting patterns P12a on the terminal circuit patterns P10a, so that the input/output pins 111a and the terminal circuit patterns P10a are electrically connected. Note that in each of the ground dielectric sheets 123b, there are formed through-holes 121ab (121a) through which the input/output pins 111a pass, in the lamination direction, at the positions corresponding to the terminal connecting patterns P12a, so that the input/output pins 111a and the ground circuit pattern P10b are not electrically connected.

Further, the ground pin 111b is fit, in the lamination direction, in the through-hole 121bb (121b) formed in the ground pattern P12b of the ground circuit pattern P10b, in particular, in the ground part P12c of the ground pattern P12b, so that the ground pin 111b and the ground circuit pattern P10b are electrically connected. Note that in the terminal dielectric sheet 123a, there is formed a through-hole 121ba (121b) through which the ground pin 111b passes, in the lamination direction, at the position corresponding to the ground part P12c of the ground pattern P12b, so that the ground pin 111b and the terminal circuit pattern P10a are not electrically connected.

Figure 8:
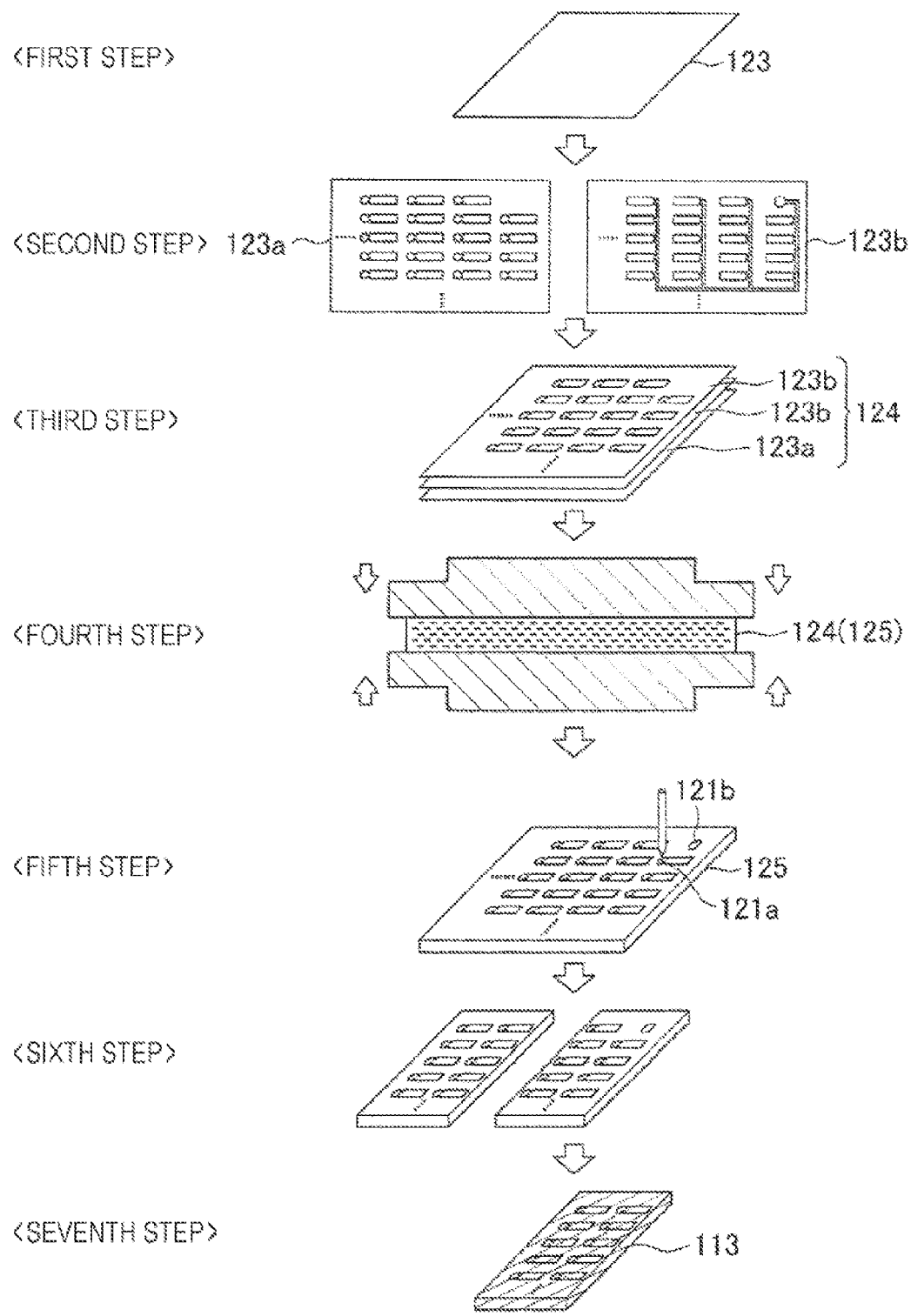
FIG. 8 is a schematic diagram schematically illustrating steps of manufacturing the laminated ceramic capacitor shown in FIG. 6.
Figure 9:
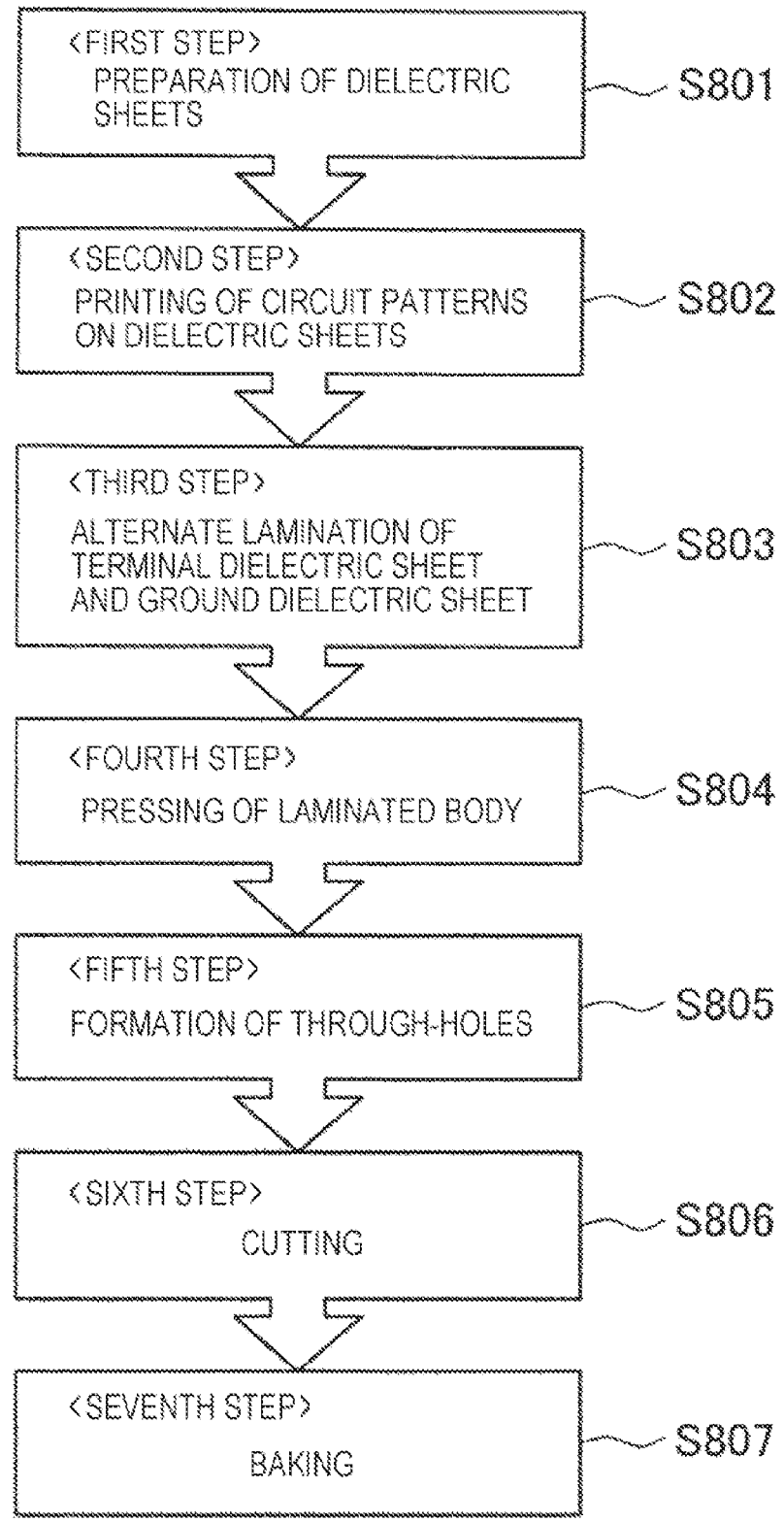
FIG. 9 is a flowchart illustrating the steps of manufacturing the laminated ceramic capacitor shown in FIG. 6.

With reference to FIG. 8 and FIG. 9, steps of manufacturing the laminated ceramic capacitor shown in FIG. 6 will be described.

When manufacturing the laminated ceramic capacitor 113, first in the first step, slurry dielectric material (ceramic material) of, for example, barium titanate or the like is formed in a sheet shape, and a dielectric sheet 123 having a thickness of, for example, approximately 1 μm is prepared (S801 of FIG. 9).

Next, in the second step, by using, for example, a thick-film printing technique, circuit patterns (the terminal circuit patterns P10a or the ground circuit pattern P10b) made of, for example, nickel paste are printed on the dielectric sheets 123, so that the terminal dielectric sheets 123a and the ground dielectric sheets 123b are prepared (S802 of FIG. 9).

Next, in the third step, the terminal dielectric sheet 123a and the ground dielectric sheet 123b are alternately laminated (for example, 300 layers for each or total of 600 layers) in the appropriate orientation to prepare a laminated body 124 (S803 of FIG. 9). Note that the number of laminations of the terminal dielectric sheets 123a and the ground dielectric sheets 123b can be changed depending on the required capacitor capacitance.

Next, in the fourth step, the laminated body 124 is pressed in the lamination direction by a pressing machine with a previously set pressure to prepare a laminated ceramic 125 (S804 of FIG. 9).

Next, in the fifth step, a through-hole process by using, for example, an inter-layer contacting technique for printed circuit boards is performed on the laminated ceramic 125 to form the through-holes 121a and 121b having an appropriate size at the positions corresponding to the terminal connecting patterns P12a of the terminal circuit pattern P10a on the terminal dielectric sheet 123a and at the position corresponding to the ground part P12c of the ground pattern P12b of the ground circuit pattern P10b on the ground dielectric sheet 123b (S805 of FIG. 9). Note that end faces of the through-holes 121a and 121b may be processed by using an appropriate end face processing technique for printed circuit boards or the like, for example.

Then, in the sixth step, by using a cutting machine, the laminated ceramic 125 in which the through-holes 121a and 121b are formed is cut to have an appropriate size (for example, an outer shape smaller than the bottom plate 115 of the connector housing 112 when viewed from the lamination direction), depending on the size of, for example, the connector housing 112 or the number of the connection terminals 111 (S806 of FIG. 9); and in the seventh step, the cut laminated ceramic 125 is baked in a high-temperature atmosphere to manufacture the laminated ceramic capacitor 113 with an intended size (S807 of FIG. 9).

Note that the connector 110 is manufactured by: fitting the connection terminals 111 of the plurality of input/output pins 111a and the ground pin 111b into the through-holes 121a and 121b of the laminated ceramic capacitor 113 manufactured by the steps described above, in the lamination direction (approximately perpendicular direction with respect to a surface of the laminated ceramic capacitor 113); and fixedly disposing the laminated ceramic capacitor 113 in contact with the bottom plate 115 of the connector housing 112 while the resin adhesive member 120 is attached to the peripheral edge of the laminated ceramic capacitor 113.

As described above, according to the first embodiment, by employing the laminated ceramic capacitor 113 with a circuit pattern which is integrally formed by laminating: the terminal dielectric sheet 123a on which the terminal circuit pattern P10a having the terminal connecting patterns P12a to be electrically connected to the plurality of connection terminals 111 and the terminal-side electrode patterns P11a connected to the terminal connecting patterns P12a is printed; and the ground dielectric sheet 123b on which the ground circuit pattern P10b having the ground-side electrode patterns P11b to be disposed to face the terminal-side electrode patterns P11a of the terminal circuit pattern P10a and the ground pattern P12b connected to the ground-side electrode patterns P11b is printed; thus, the terminal-side electrode patterns P11a and the ground-side electrode patterns P11b can be disposed via the dielectric material, whereby the capacitor capacitance can be increased without increasing the sizes of the laminated ceramic capacitor 113, the connector 110 in which the laminated ceramic capacitor 113 is mounted, or the control apparatus 100 using the connector 110.

In addition, since printing on the dielectric sheets 123 is used to form the terminal-side electrode patterns P11a of the terminal circuit pattern P10a and the ground-side electrode patterns P11b of the ground circuit pattern P10b which define the capacitor capacitance, it is possible to easily adjust the capacitor capacitances for the connection terminals (input/output pins) by modifying the terminal-side electrode patterns P11a of the terminal circuit pattern P10a or the ground-side electrode patterns P11b of the ground circuit pattern P10b, at the time of manufacturing the terminal dielectric sheets 123a and the ground dielectric sheets 123b.

Figure 10:
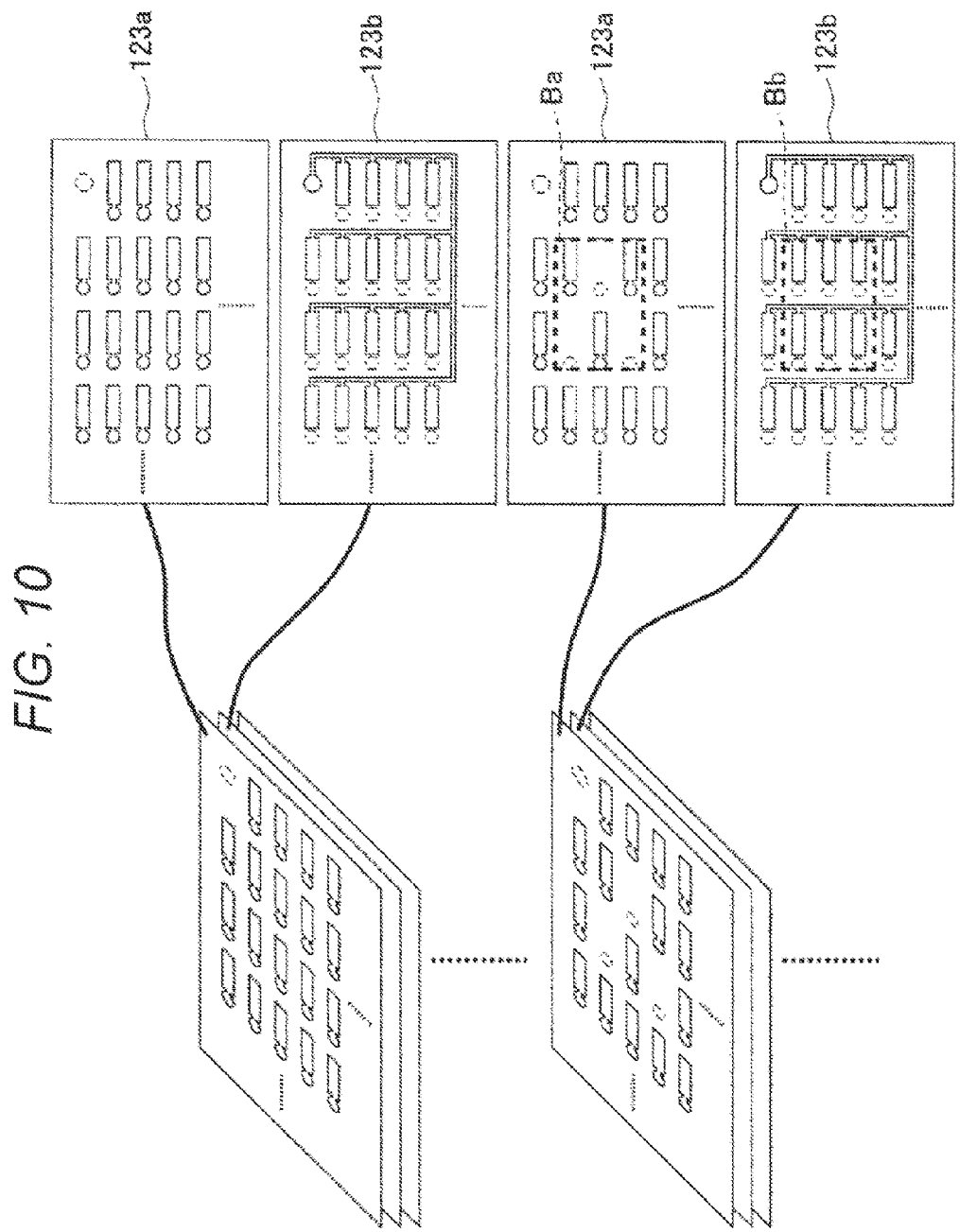
FIG. 10 is a diagram showing another example of the terminal dielectric sheet and the ground dielectric sheet forming the laminated ceramic capacitor shown in FIG. 6.

For example, as shown in FIG. 10, the capacitor capacitances can be easily reduced by omitting a part (Ba part and Bb part in the drawing) of the terminal-side electrode patterns P11a of the terminal circuit pattern P10a or the ground-side electrode patterns P11b of the ground circuit pattern P10b or by reducing the printing area of the patterns, at the time of printing the terminal circuit pattern P10a on the terminal dielectric sheet 123a or printing the ground circuit pattern P10b on the ground dielectric sheet 123b.

Figure 11:
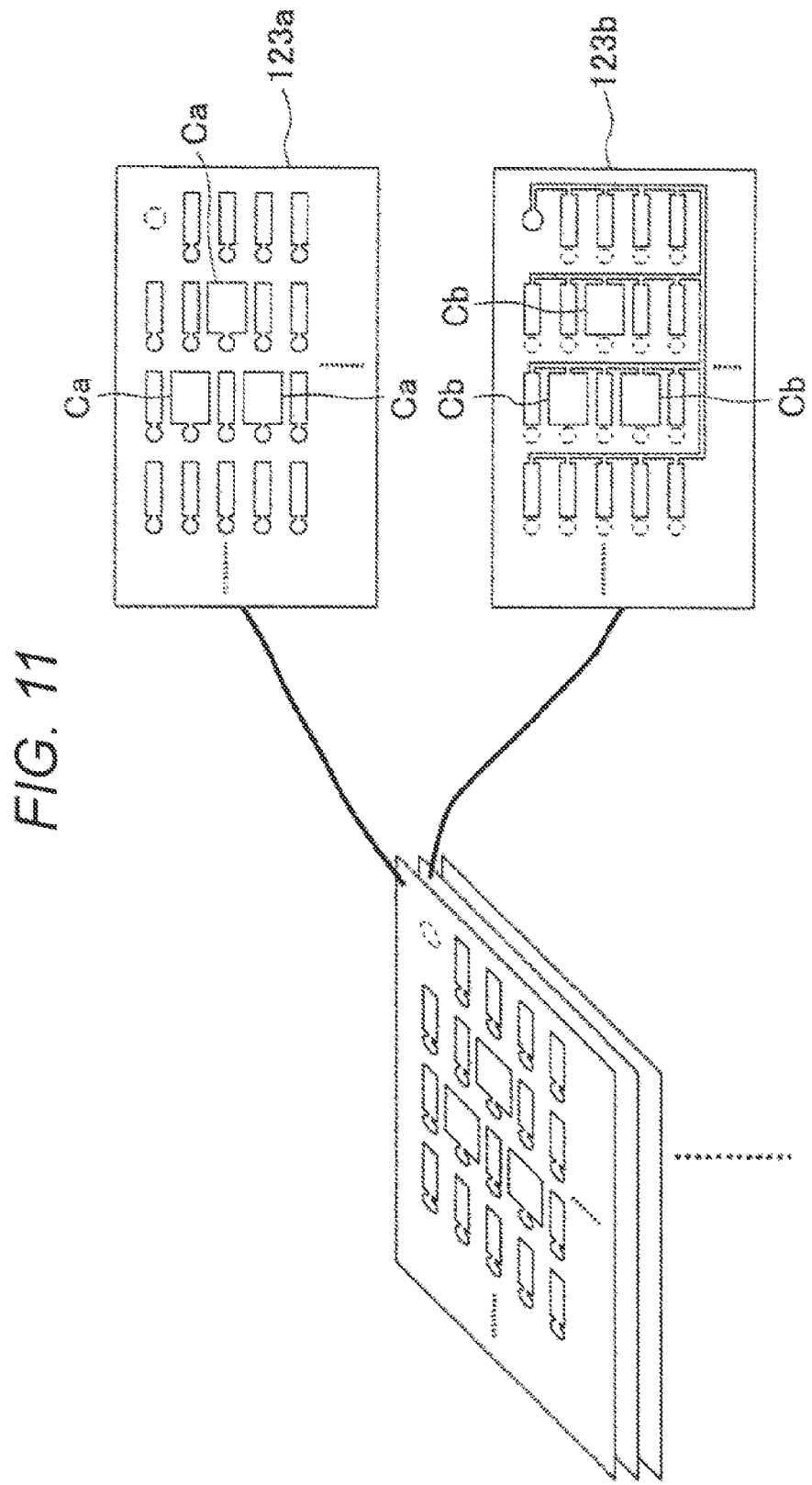
FIG. 11 is a diagram showing still another example of the terminal dielectric sheet and the ground dielectric sheet forming the laminated ceramic capacitor shown in FIG. 6.

Further, for example, as shown in FIG. 11, the capacitor capacitances can be easily increased by increasing the printing areas of the parts (Ca parts and Cb parts in the drawing) of the terminal-side electrode patterns P11a of the terminal circuit pattern P10a and the ground-side electrode patterns P11b of the ground circuit pattern P10b, at the time of printing the terminal circuit pattern P10a on the terminal dielectric sheet 123a and the ground circuit pattern P10b on the ground dielectric sheet 123b.

Further, according to the first embodiment, the laminated ceramic capacitor 113, which can realize small size, light weight, and high-capacitance, is disposed in the connector housing 112, in particular, disposed in contact with the bottom plate 115 of the connector housing 112, and the laminated ceramic capacitor 113 is embedded in the connector 110 for integration; thus, it is possible to downsize the printed circuit board 105 on which the connector 110 and the electronic component are mounted, for example, whereby the whole of the control apparatus 100 can be effectively downsized and lightened. Further, the connector 110 can be attached to the main body case 101 of the control apparatus 100 while keeping the posture in which the laminated ceramic capacitor 113 is integrated in the connector 110; thus, there are provided advantages that man-hours for manufacturing the control apparatus 100 can be reduced and that the manufacturing cost can thus be reduced.

[Second Embodiment]

Figure 12:
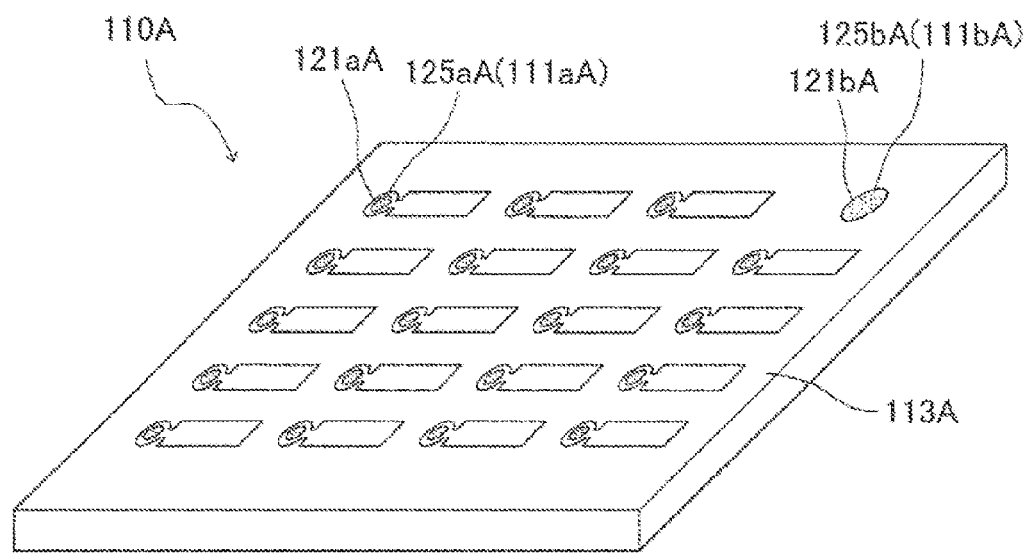
FIG. 12 is a perspective view showing a basic configuration of a connector applied to a second embodiment of the control apparatus according to the present invention.

FIG. 12 shows a basic configuration of a connector applied to a second embodiment of the control apparatus according to the present invention. The second embodiment is different from the first embodiment in the configuration of the connection terminals of the connector, but is the same as the first embodiment in the other configuration. Therefore, the same components as in the first embodiment are assigned the same reference signs, and the detailed description is omitted.

In a connector 110A shown in FIG. 12, the connection terminals 111A which connect a printed circuit board to an external device and external wires are formed of conductive materials 125aA and 125bA, where the conductive materials 125aA and 125bA are made to fill through-holes 121aA and 121bA and are solidified, and the through-holes 121aA and 121bA are formed, in the lamination direction, at the positions corresponding to terminal connecting patterns of a terminal circuit pattern and to a ground part of a ground pattern of a ground circuit pattern. Here, the conductive materials 125aA and 125bA made to fill the through-holes 121aA and 121bA are formed to be approximately flush with the surface of a laminated ceramic capacitor 113A.

That is to say, in the second embodiment, molten conductive material made of, for example, solder or the like is made to fill the through-holes 121aA and 121bA formed, in the lamination direction, at the positions corresponding to the terminal connecting patterns of the terminal circuit pattern and the ground part of the ground pattern of the ground circuit pattern, and is solidified in a predetermined atmosphere, so that the connection terminals 111A are formed which are input/output terminals 111aA formed of the conductive materials 125aA and a ground terminal 111bA formed of the conductive material 125bA, where the surfaces of the connection terminals 111A are approximately flush with the surface of the laminated ceramic capacitor 113A.

As described above, according to the second embodiment, the connection terminals 111A such as the input/output terminals 111aA and the ground terminal 111bA are formed of the conductive materials 125aA and 125bA made to fill the through-holes 121aA and 121bA, so that it is easy to manufacture the connector which is equipped with the connection terminals having the surfaces which are approximately flush with the surface of the laminated ceramic capacitor 113A used for, for example, a USB connector or the like, whereby an application field of the connector 110A can be enlarged.

Figure 13:
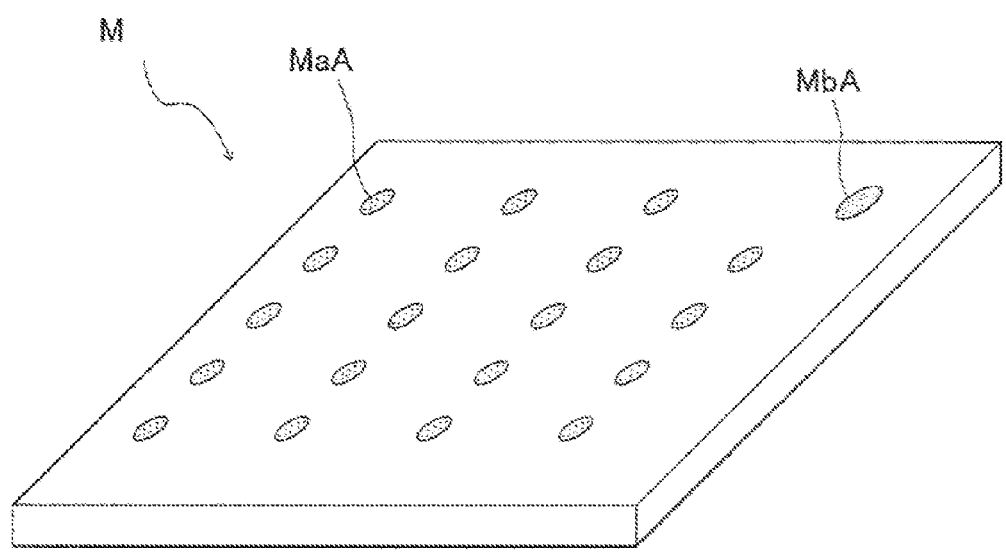
FIG. 13 is a perspective view showing an example of a connector corresponding to the connector shown in FIG. 12.

Note that a female connector M corresponding to the male connector 110A shown in FIG. 12 can be manufactured by forming, in dielectric material made of ceramic or the like, through-holes MaA and MbA at the positions corresponding to the through-holes 121aA and 121bA of the connector 110A as shown in FIG. 13, and by filling the through-holes MaA and MbA with conductive material for forming connection terminals and then solidifying the conductive material, or by fitting into the through-holes MaA and MbA metal pins for connection which are to form connection terminals.

[Third Embodiment]

Figure 14:
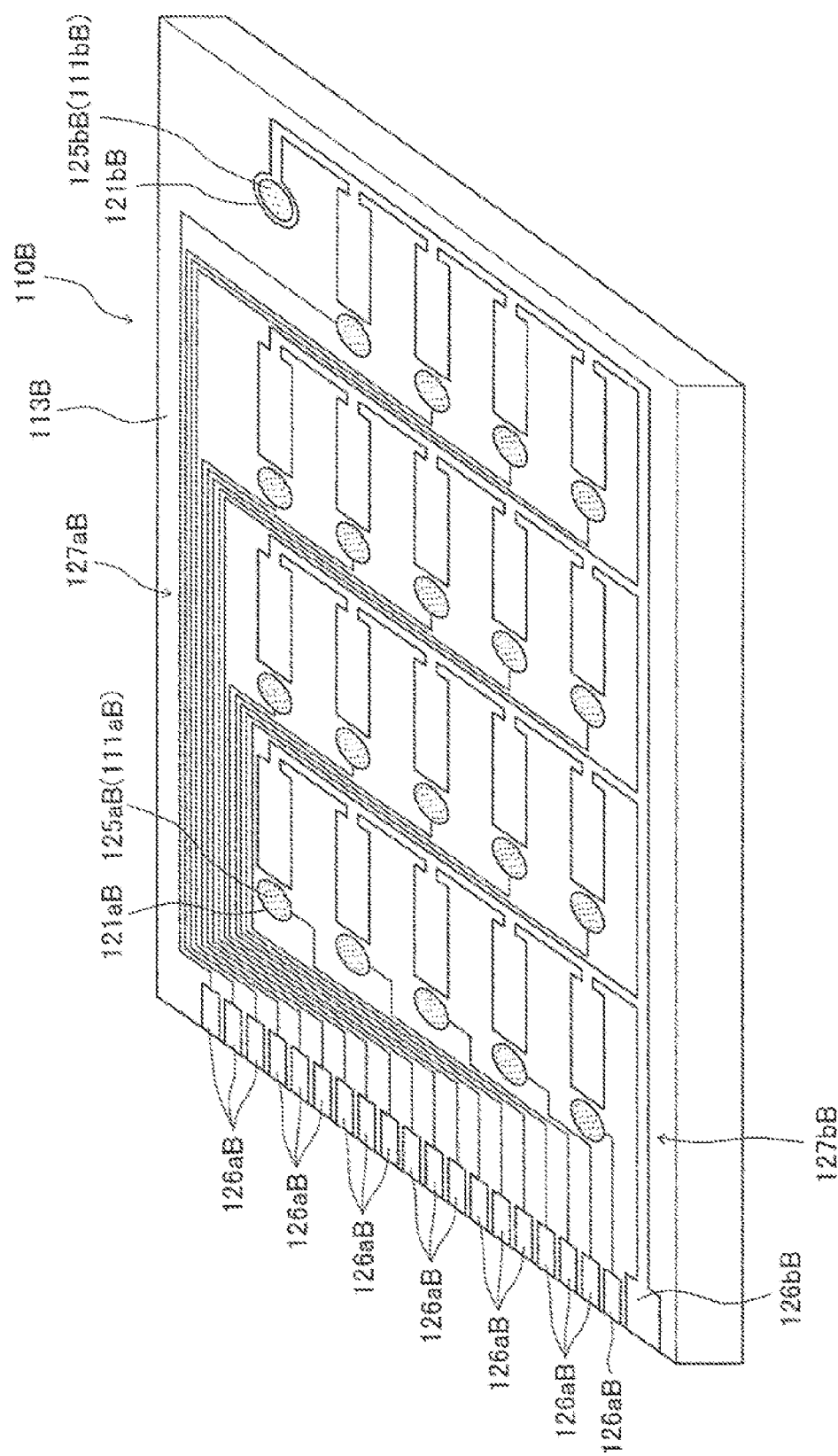
FIG. 14 is a perspective view showing a basic configuration of a connector applied to a third embodiment of the control apparatus according to the present invention.

FIG. 14 shows a basic configuration of a connector applied to a third embodiment of the control apparatus according to the present invention. The third embodiment is different from the first and second embodiments in the configuration of the connection terminals of the connector and the circuit pattern printed on the surface, but is the same as the first and second embodiments in the other configuration. Therefore, the detailed description of the same configuration to the first and second embodiments is omitted.

A connector 110B shown in FIG. 14 is a contact type connector to be used for, for example, a USB connector and the like, and the connector 110B is formed, similarly to the above second embodiment, such that through-holes 121aB and 121bB are formed, in a lamination direction of a laminated ceramic capacitor 113B, at positions corresponding to terminal connecting patterns of a terminal circuit pattern printed on a terminal dielectric sheet and at positions corresponding to a ground part of a ground pattern of a ground circuit pattern printed on a ground dielectric sheet, and that in the through-holes 121aB and 121bB, conductive materials 125aB and 125bB made of, for example, solder or the like are made to fill and are solidified, and there are formed parts of input/output terminals 111aB and a ground terminal 111bB forming connection terminals 111B.

Further, in the third embodiment, on one side edge of a surface of the approximately rectangular connector 110B, there are disposed: a plurality (19 terminals in the drawing) of approximately plate-shaped (input/output) contact terminals 126aB forming parts of connection terminals 111B; and a (ground) contact terminal 126bB.

Further, the contact terminals 126aB arranged on the one side edge of the surface of the connector 110B and conductive materials 125aB made to fill the through-holes 121aB are electrically connected to each other through a circuit pattern 127aB additionally printed on the surface of the laminated ceramic capacitor 113B, so that the input/output terminals 111aB are formed of the conductive materials 125aB, the circuit pattern 127aB, and the contact terminals 126aB.

In addition, the contact terminal 126bB arranged on the one side edge of the surface of the connector 110B and the conductive material 125bB made to fill a through-hole 121bB are electrically connected to each other through a circuit pattern 127bB additionally printed on the surface of the laminated ceramic capacitor 113B, so that the ground terminal 111bB is formed of the conductive material 125bB, the circuit pattern 127bB, and the contact terminal 126bB.

That is to say, in the third embodiment, the terminal connecting patterns of the terminal circuit pattern are electrically connected to the input/output terminals 111aB formed of the conductive materials 125aB made to fill the through-holes 121aB, the circuit pattern 127aB formed on the surface of the laminated ceramic capacitor 113B, and the contact terminals 126aB for input/output; and the ground pattern of the ground circuit pattern is electrically connected to the ground terminal 111bB formed of the conductive material 125bB made to fill the through-hole 121bB, the circuit pattern 127bB formed on the surface of the laminated capacitor 113B, and the contact terminal 126bB for ground.

In this way, according to the third embodiment, the connection terminals 111B such as the input/output terminals 111aB and the ground terminal 111bB are formed of the conductive materials 125aB and 125bB made to fill the through-holes 121aB and 121bB, the circuit patterns 127aB and 127bB formed on the surface of the laminated capacitor 113B, and the contact terminals 126aB and 126bB arranged on the one side edge of the surface of the connector 110B; thus, it is easy to manufacture a contact type connector which is used for, for example, a USB connector or the like and which is small, light, and high capacitance, whereby the field of application of the connector 110B can be enlarged.

Note that, in the first and second embodiments described above, the descriptions are made on the aspects in which the dielectric sheets forming the laminated ceramic capacitor is formed of barium titanate ($BaTiO_3$) to secure a capacitor capacitance; however, the dielectric sheet may be made of, for example, calcium titanate ($CaTiO_3$), strontium titanate ($SrTiO_3$), calcium zirconate ($CaZrO_3$), or the like.

Further, the circuit pattern printed on the surface of the dielectric sheet and the surface of the laminated ceramic capacitor can be appropriately modified depending on required performances such as the number or the arrangement of the connection terminals.

Further, it is possible to appropriately modify, for example, the followings: a shape and a size of a connector housing containing a laminated ceramic capacitor; a position of disposition of a connector in a main body case or how to fix the connector; a position of disposition of a printed circuit board in a main body case or how to fix the printed circuit board; a position of disposition of an electronic component on a printed circuit board or how to fix the electronic component; and a type and a number of electronic component.

Note that the present invention is not limited to the first to third embodiments and includes various types of deformation. For example, the first to third embodiments describe in detail for easy-to-understand description, but the present invention does not need to be equipped with all the described components. Further, it is possible to replace a part of the components of an embodiment with a component of another embodiment, and it is also possible to add, to a component of an embodiment, a component of another embodiment. Further, regarding a part of the components of the first to third embodiments, another component can be added, removed, and replaced.

Further, regarding control lines and information lines, the lines which are thought to be necessary for description are shown, and not all the control lines and the information lines which are necessary as a product are shown. It can be thought that almost all the components are actually connected to each other.

REFERENCE SIGNS LIST 100 control apparatus
101 main body case
102 fixing member
103 IC
104 capacitor
105 printed circuit board (substrate)
106 through-hole in main body case
110 connector
111 connection terminal
111a input/output pin
111b ground pin
112 connector housing
113 laminated ceramic capacitor (laminated capacitor)
114 cylindrical body of connector housing
115 bottom plate of connector housing
116 projection portion of cylindrical body
117 through-hole in bottom plate
118 positioning part
119 thick part
120 resin adhesive member (buffering member)
121 through-hole in laminated ceramic capacitor
122 positioning hole in laminated ceramic capacitor
123 dielectric sheet
123a terminal dielectric sheet
123b ground dielectric sheet
124 laminated body of terminal dielectric sheets and ground dielectric sheets
P10a terminal circuit pattern
P10b ground circuit pattern
P11a terminal-side electrode pattern
P11b ground-side electrode pattern
P12a terminal connecting pattern
P12b ground pattern

The invention claimed is:

1. A control apparatus comprising:
a substrate on which an electronic component for controlling an external device is mounted;
a connector which electrically connects the substrate to the external device or external wires,
wherein the connector includes:
a connector housing;
a plurality of connection terminals which are housed in the connector housing and connect the substrate to the external device or the external wires; and
a laminated capacitor in which a terminal dielectric sheet on which a terminal circuit pattern is printed and a ground dielectric sheet on which a ground circuit pattern is printed are alternately laminated into one body,
the terminal circuit pattern includes:
terminal connecting patterns electrically connected to the plurality of connection terminals; and
terminal-side electrode patterns connected to the terminal connecting patterns, and
the ground circuit pattern includes:
ground-side electrode patterns disposed to face the terminal-side electrode patterns; and
a ground pattern connected to the ground-side electrode patterns.

2. The control apparatus of claim 1, wherein
through-holes are formed, in a lamination direction of the laminated capacitor, at positions corresponding to the terminal connecting patterns of the terminal circuit pattern and/or the ground pattern of the ground circuit pattern,
the connection terminals having a rod shape are fit in the through-holes, and
the terminal connecting patterns of the terminal circuit pattern and/or the ground pattern of the ground circuit pattern are electrically connected to the connection terminals.

3. The control apparatus of claim 1, wherein
through-holes are formed, in a lamination direction of the laminated capacitor, at positions corresponding to the terminal connecting patterns of the terminal circuit pattern and/or the ground pattern of the ground circuit pattern,
conductive material forming the connection terminals is made to fill the through-holes and is solidified, and
the terminal connecting patterns of the terminal circuit pattern and/or the ground pattern of the ground circuit pattern are electrically connected to the conductive material.

4. The control apparatus of claim 1, wherein the conductive material is made to fill through-holes such that the conductive material is flush with a surface of the laminated capacitor.

5. The control apparatus of claim 1, wherein
through-holes are formed, in a lamination direction of the laminated capacitor, at positions corresponding to the terminal connecting patterns of the terminal circuit pattern and/or the ground pattern of the ground circuit pattern,
conductive material forming the connection terminals is made to fill the through-holes and is solidified,
contact terminals are disposed on a surface of the laminated capacitor, and
the terminal connecting patterns of the terminal circuit pattern and/or the ground pattern of the ground circuit pattern are electrically connected to the contact terminals through the conductive material and circuit patterns formed on a surface of the laminated capacitor.

6. The control apparatus of claim 1, wherein the connector includes the connector housing which has:
a cylindrical body covering a periphery of the plurality of connection terminals; and
a bottom plate which closes an end part of the cylindrical body on a side of the substrate and in which there are formed through-holes through which parts of the plurality of connection terminals pass, and
the laminated capacitor is disposed in the connector housing.

7. The control apparatus of claim 6, wherein the laminated capacitor is disposed in contact with the bottom plate of the connector housing.

8. The control apparatus of claim 7, wherein a buffering member is disposed on a peripheral edge of the laminated capacitor.

9. A connector which electrically connects a substrate, on which an electronic component for controlling an external device is mounted, to the external device or external wires, the connector comprising:
- a connector housing;
- a plurality of connection terminals which are housed in the connector housing and connect the substrate to the external device or the external wires; and
- a laminated capacitor in which a terminal dielectric sheet on which a terminal circuit pattern is printed and a ground dielectric sheet on which a ground circuit pattern is printed are alternately laminated into one body,
- wherein the terminal circuit pattern includes:
  - terminal connecting patterns electrically connected to the plurality of connection terminals; and
  - terminal-side electrode patterns connected to the terminal connecting patterns, and
- the ground circuit pattern includes:
  - ground-side electrode patterns disposed to face the terminal-side electrode patterns; and
  - a ground pattern connected to the ground-side electrode patterns.

10. The connector of claim 9, wherein through-holes are formed, in a lamination direction of the laminated capacitor, at positions corresponding to the terminal connecting patterns of the terminal circuit pattern and/or the ground pattern of the ground circuit pattern,
- the connection terminals having a rod shape are fit in the through-holes, and
- the terminal connecting patterns of the terminal circuit pattern and/or the ground pattern of the ground circuit pattern are electrically connected to the connection terminals.

11. The connector of claim 9, wherein through-holes are formed, in a lamination direction of the laminated capacitor, at positions corresponding to the terminal connecting patterns of the terminal circuit pattern and/or the ground pattern of the ground circuit pattern,
- conductive material forming the connection terminals is made to fill the through-holes and is solidified, and
- the terminal connecting patterns of the terminal circuit pattern and/or the ground pattern of the ground circuit pattern are electrically connected to the conductive material.

12. The connector of claim 9, wherein the conductive material is made to fill the through-holes such that the conductive material is flush with a surface of the laminated capacitor.

13. The connector of claim 9, wherein through-holes are formed, in a lamination direction of the laminated capacitor, at positions corresponding to the terminal connecting patterns of the terminal circuit pattern and/or the ground pattern of the ground circuit pattern,
- conductive material forming the connection terminals is made to fill the through-holes and is solidified,
- contact terminals are disposed on a surface of the laminated capacitor, and
- the terminal connecting patterns of the terminal circuit pattern and/or the ground pattern of the ground circuit pattern are electrically connected to the contact terminals through the conductive material and circuit patterns formed on a surface of the laminated capacitor.

14. The connector of claim 9, wherein the connector includes the connector housing which has:
- a cylindrical body covering a periphery of the plurality of connection terminals; and
- a bottom plate which closes an end part of the cylindrical body on a side of the substrate and in which there are formed through-holes through which parts of the plurality of connection terminals pass, and
- the laminated capacitor is disposed in the connector housing.

15. The connector of claim 14, wherein the laminated capacitor is disposed in contact with the bottom plate of the connector housing.

16. The connector of claim 15, wherein a buffering member is disposed on a peripheral edge of the laminated capacitor.

17. A laminated capacitor for a connector which electrically connects a substrate, on which an electronic component for controlling an external device is mounted, to the external device or external wires, the laminated capacitor comprising:
- a terminal dielectric sheet and a ground dielectric sheet which are alternately laminated into one body,
- wherein on the terminal dielectric sheet, a terminal circuit pattern having terminal connecting patterns electrically connected to a plurality of connection terminals which connect the substrate to the external device or the external wires and terminal-side electrode patterns connected to the terminal connecting patterns is printed, and
- on the ground dielectric sheet, a ground circuit pattern having ground-side electrode patterns disposed to face the terminal-side electrode patterns and a ground pattern connected to the ground-side electrode patterns is printed.

18. The laminated capacitor for a connector of claim 17, wherein through-holes are formed, in a lamination direction of the laminated capacitor, at positions corresponding to the terminal connecting patterns of the terminal circuit pattern and/or the ground pattern of the ground circuit pattern.

* * * * *